(12) United States Patent
Park et al.

(10) Patent No.: US 11,393,795 B2
(45) Date of Patent: Jul. 19, 2022

(54) SEMICONDUCTOR PACKAGE

(71) Applicant: SAMSUNG ELECTRONICS CO., LTD., Suwon-si (KR)

(72) Inventors: Yongjin Park, Yongin-si (KR); Sunghawn Bae, Suwon-si (KR); Won Choi, Asan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/019,616

(22) Filed: Sep. 14, 2020

(65) Prior Publication Data

US 2021/0257337 A1 Aug. 19, 2021

(30) Foreign Application Priority Data

Feb. 17, 2020 (KR) ........................ 10-2020-0019002

(51) Int. Cl.
*H01L 25/065* (2006.01)
*H01L 25/10* (2006.01)
(Continued)

(52) U.S. Cl.
CPC .......... *H01L 25/0657* (2013.01); *H01L 24/05* (2013.01); *H01L 24/13* (2013.01); *H01L 24/48* (2013.01); *H01L 24/49* (2013.01); *H01L 24/73* (2013.01); *H01L 25/105* (2013.01); *H01L 25/18* (2013.01); *H01L 25/50* (2013.01); *H01L 2224/02331* (2013.01); *H01L 2224/02379* (2013.01); *H01L 2224/02381* (2013.01); *H01L 2224/0401* (2013.01); *H01L 2224/13024* (2013.01); *H01L 2224/48108* (2013.01); *H01L 2224/48157* (2013.01); *H01L 2224/49173* (2013.01); *H01L 2224/73265* (2013.01); *H01L 2225/0651* (2013.01); *H01L 2225/06548* (2013.01); *H01L 2225/06558* (2013.01); *H01L 2225/06568* (2013.01);
(Continued)

(58) Field of Classification Search
CPC .................................................. H01L 25/0657
See application file for complete search history.

(56) References Cited

U.S. PATENT DOCUMENTS 6,157,080 A * 12/2000 Tamaki ................... H01L 24/32
257/784
6,518,655 B2 * 2/2003 Morinaga ........... H01L 23/3121
257/E23.125
(Continued)

FOREIGN PATENT DOCUMENTS

KR 10-1332859 B1 12/2013

*Primary Examiner* — William A Harriston
(74) *Attorney, Agent, or Firm* — Lee IP Law, PC

(57) ABSTRACT

A semiconductor package includes: a redistribution substrate; a frame including first and second vertical connection conductors, and having a through-hole; first and second semiconductor chips; an encapsulant; a second redistribution structure disposed on the encapsulant, a conductive wire electrically connecting the second semiconductor chip and the second vertical connection conductor; and a vertical connection via penetrating a portion of the encapsulant, and electrically connecting the second redistribution structure and the first vertical connection conductor. The first semiconductor chip is connected to the second vertical connection conductor by the first redistribution structure.

20 Claims, 15 Drawing Sheets

(51) Int. Cl.
  *H01L 25/18* (2006.01)
  *H01L 23/00* (2006.01)
  *H01L 25/00* (2006.01)

(52) U.S. Cl.
  CPC ............ *H01L 2225/06586* (2013.01); *H01L 2225/1035* (2013.01); *H01L 2225/1041* (2013.01); *H01L 2225/1058* (2013.01)

(56) References Cited

U.S. PATENT DOCUMENTS

| | | | | |
|---|---|---|---|---|
| 7,321,164 B2* | 1/2008 | Hsu | ................ | H01L 24/82 |
| | | | | 257/725 |
| 7,842,541 B1* | 11/2010 | Rusli | ................ | H01L 23/49816 |
| | | | | 438/106 |
| 8,737,085 B2* | 5/2014 | Sasaoka | ................ | H05K 1/186 |
| | | | | 174/250 |
| 9,679,873 B2 | 6/2017 | Keser et al. | | |
| 10,510,645 B2* | 12/2019 | Wang | ................ | H01L 23/49822 |
| 10,547,119 B2* | 1/2020 | Kim | ................ | H01Q 1/38 |
| 10,790,162 B2* | 9/2020 | Tsai | ................ | H01L 24/09 |
| 10,804,205 B1* | 10/2020 | Lin | ................ | H01L 23/5383 |
| 2008/0258286 A1* | 10/2008 | Gerber | ................ | H01L 25/0657 |
| | | | | 257/E23.18 |
| 2009/0032933 A1* | 2/2009 | Tracht | ................ | H01L 24/19 |
| | | | | 438/118 |
| 2010/0038761 A1* | 2/2010 | Tay | ................ | H01L 23/13 |
| | | | | 257/676 |
| 2011/0193203 A1* | 8/2011 | Goto | ................ | H01L 23/552 |
| | | | | 257/737 |
| 2013/0127054 A1* | 5/2013 | Muthukumar | ................ | H01L 24/73 |
| | | | | 257/738 |
| 2013/0307143 A1 | 11/2013 | Lin et al. | | |
| 2015/0228628 A1* | 8/2015 | Pagaila | ................ | H01L 24/97 |
| | | | | 257/774 |
| 2016/0021753 A1* | 1/2016 | Tomikawa | ................ | H05K 3/4697 |
| | | | | 361/761 |
| 2016/0079110 A1* | 3/2016 | Chuang | ................ | H01L 23/528 |
| | | | | 257/773 |
| 2016/0293580 A1* | 10/2016 | Lee | ................ | H01L 21/31133 |
| 2016/0338202 A1* | 11/2016 | Park | ................ | H01L 23/5389 |
| 2017/0069564 A1 | 3/2017 | Kwon et al. | | |
| 2018/0233454 A1 | 8/2018 | Kim et al. | | |
| 2018/0315737 A1 | 11/2018 | Meyer et al. | | |
| 2019/0131224 A1* | 5/2019 | Choi | ................ | H01L 23/5226 |
| 2019/0164863 A1 | 5/2019 | Cho et al. | | |
| 2019/0189589 A1* | 6/2019 | Jung | ................ | H01L 24/32 |
| 2020/0111765 A1* | 4/2020 | Kim | ................ | H01L 21/4853 |
| 2020/0144173 A1* | 5/2020 | Kim | ................ | H01L 24/20 |
| 2021/0020505 A1* | 1/2021 | Jang | ................ | H01L 25/50 |

* cited by examiner

SEMICONDUCTOR PACKAGE

CROSS-REFERENCE TO RELATED APPLICATION

Korean Patent Application No. 10-2020-0019002, filed on Feb. 17, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

In recent years, a package technology aiming at achieving lightening and miniaturization has been actively researched. A package on package (POP) semiconductor package may include different semiconductor chips, and may have a backside circuit in a semiconductor package structure.

SUMMARY

Embodiments are directed to a semiconductor package, including a redistribution substrate including a first redistribution structure; a frame on the redistribution substrate, the frame including a first vertical connection conductor and a second vertical connection conductor that are electrically connected to the first redistribution structure, the frame having a through-hole; a first semiconductor chip in the through-hole, and having a first active surface, on which a first connection pad is disposed, and a first inactive surface that opposes the first active surface, the first connection pad being connected to the second vertical connection conductor by the first redistribution structure; a second semiconductor chip on the first semiconductor chip, and having a second active surface, on which a second connection pad is disposed, and a second inactive surface that opposes the second active surface; an encapsulant on the redistribution substrate, and encapsulating at least a portion of the frame, the first semiconductor chip, and the second semiconductor chip; a second redistribution structure on the encapsulant; a conductive wire electrically connecting the second connection pad and the second vertical connection conductor; and a vertical connection via penetrating a portion of the encapsulant and electrically connecting the second redistribution structure and the first vertical connection conductor.

Embodiments are also directed to a semiconductor package, including a redistribution substrate including a first redistribution structure; a frame on the redistribution substrate, the frame including a first vertical connection conductor and a second vertical connection conductor that are electrically connected to the first redistribution structure, the frame having a through-hole; a first semiconductor chip in the through-hole, and including a first connection pad electrically connected to the first redistribution structure; a second semiconductor chip on an upper surface of the first semiconductor chip, and including a second connection pad electrically connected to the second vertical connection conductor through a conductive wire; an encapsulant encapsulating at least a portion of the frame, the first semiconductor chip, and the second semiconductor chip; and a second redistribution structure on the encapsulant, and electrically connected to the first vertical connection conductor. A thickness of the first semiconductor chip may be greater than a thickness of the second semiconductor chip. A width of the first semiconductor chip may be greater than a width of the second semiconductor chip. An upper surface of the second semiconductor chip may be located at a level that is higher than an upper surface of the frame.

Embodiments are also directed to a semiconductor package, including a lower semiconductor package, an upper semiconductor package on the lower semiconductor package, and a conductive bump electrically connecting the lower semiconductor package to the upper semiconductor package. The lower semiconductor package may include a redistribution substrate including a first redistribution structure, a frame on the redistribution substrate, the frame including a first vertical connection conductor and a second vertical connection conductor that are electrically connected to the first redistribution structure, the frame having a through-hole, a first semiconductor chip in the through-hole, and including a first connection pad electrically connected to the first redistribution structure, a second semiconductor chip on an upper surface of the first semiconductor chip, and including a second connection pad electrically connected to the second vertical connection conductor through a conductive wire, an encapsulant encapsulating at least a portion of the frame, the first semiconductor chip, and the second semiconductor chip, and a second redistribution structure on the encapsulant, and electrically connected to the first vertical connection conductor. The upper semiconductor package may include a redistribution member including redistribution pads electrically connected to the second redistribution structure, a third semiconductor chip on the redistribution member and electrically connected to the redistribution pads, and an encapsulating member encapsulating the third semiconductor chip. A thickness of the first semiconductor chip may be greater than a thickness of the second semiconductor chip. A width of the first semiconductor chip may be greater than a width of the second semiconductor chip. An upper surface of the second semiconductor chip may be located at a level that is higher than an upper surface of the frame.

BRIEF DESCRIPTION OF DRAWINGS

Features will become apparent to those of skill in the art by describing in detail example embodiments with reference to the attached drawings in which:

FIG. 2 is a plan view illustrating some components in the semiconductor package of

FIG. 1;

DETAILED DESCRIPTION

Figure 1:
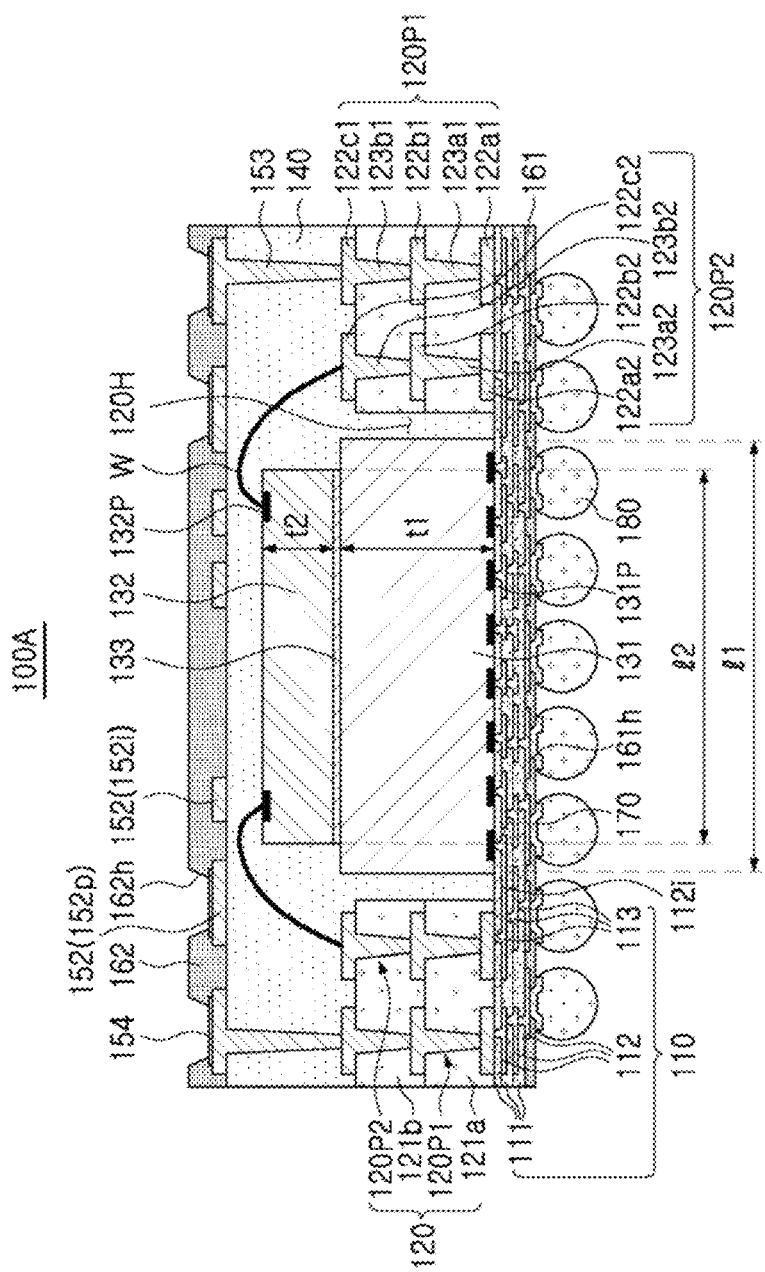
FIG. 1 is a cross-sectional view illustrating a semiconductor package according to an example embodiment.
Figure 2:
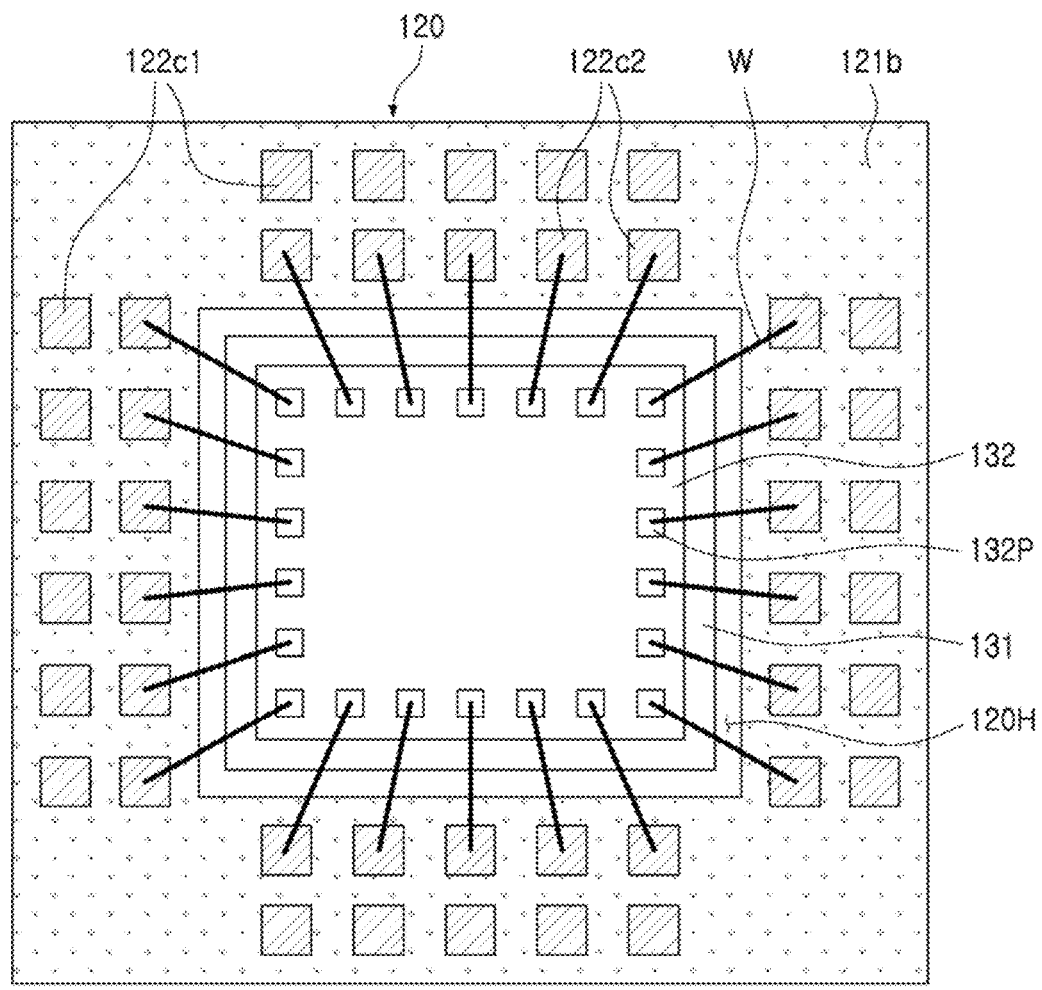

FIG. 1 is a cross-sectional view illustrating a semiconductor package 100A according to an example embodiment, and FIG. 2 is a plan view illustrating some components in the semiconductor package 100A of FIG. 1.

In FIG. 2, a second redistribution structure, an encapsulant, and the like is omitted, in order to clearly indicate a connection form between a second semiconductor chip 132 and a second vertical connection conductor 120P2 in the semiconductor package 100A of FIG. 1.

Referring to FIGS. 1 and 2, the semiconductor package 100A may include a redistribution substrate 110, a frame 120, a first semiconductor chip 131, a second semiconductor chip 132, an encapsulant 140, a second redistribution structure 152, a conductive wire W, and a vertical connection via 153.

The redistribution substrate 110 may include an insulating layer 111, a first redistribution structure 112 (or "a first redistribution layer") disposed on the insulating layer 111, and redistribution vias 113 that penetrate the insulating layer 111 and electrically connect the first redistribution structure 112 with first and second vertical connection conductors 120P1 and 120P2 and a first connection pad 131P of the first semiconductor chip 131. The redistribution substrate 110 may redistribute connection pads 131P and 132P of the first and second semiconductor chips 131 and 132 to a fan-out region, and may physically and/or electrically connect the connection pads 131P and 132P externally through a connection bump 180. The number of the insulating layer 111, the first redistribution structure 112, and the redistribution vias 113 may be greater or smaller that shown in the drawing.

The insulating layer 111 may include an insulating material. For example, a photosensitive insulating material (PID) may be used as the insulating material, and in this case, a fine pitch through a photo via may be implemented. Boundaries of the insulating layers 111 may be separated from each other, and boundaries thereof may not be readily apparent.

The first redistribution structure 112 may redistribute the first connection pad 131P of the first semiconductor chip 131 to electrically connect the first and second vertical connection conductors 120P1 and 120P2 and the connection bump 180. For example, the first redistribution structure 112 may include a connection pattern portion 112i that electrically connects the first connection pad 131P and the second vertical connection conductor 120P2. Elements of the first redistribution structure 112 may be connected to each other via a region not shown in the drawing. Therefore, the first connection pads 131P of the first semiconductor chip 131 may be electrically connected to the first and second vertical connection conductors 120P1 and 120P2 and the connection bump 180 through the first redistribution structure 112 that are not directly connected in the drawing, such as the connection pattern portion 112i.

The first redistribution structure 112 may include copper (Cu), aluminum (Al), silver (Ag), tin (Sn), gold (Au), nickel (Ni), lead (Pb), titanium (Ti), or alloys thereof. The first redistribution structure 112 may perform various functions depending on the design. For example, the first redistribution structure 112 may include a ground (GND) pattern, a power (PWR) pattern, a signal (S) pattern, and the like. The ground (GND) pattern and the power (PWR) pattern may be the same patterns. The first redistribution structure 112 may include a pad for redistribution vias, and a pad for connection bumps. The first redistribution structure 112 may be formed by a plating process, and may include a seed layer and a conductor layer.

The redistribution vias 113 may electrically connect the first redistribution structure 112 formed on different layers, and may also electrically connect the connection pad 131P of the first semiconductor chip 131 and the first and second vertical connection conductors 120P1 and 120P2 to the first redistribution structure 112. The redistribution vias 113 may physically contact a connection electrode 120P when the first semiconductor chip 131 is a bare die.

The redistribution vias 113 may include copper (Cu), aluminum (Al), silver (Ag), tin (Sn), gold (Au), nickel (Ni), lead (Pb), titanium (Ti), or alloys thereof. The redistribution vias 113 may include copper (Cu), aluminum (Al), silver (Ag), tin (Sn), gold (Au), nickel (Ni), lead (Pb), titanium (Ti), or alloys thereof. The redistribution vias 113 may include a signal via, a power via, a ground via, and the like, and the power via and the ground via may be the same vias. The redistribution vias 113 may be filled-type vias filled with a metal material, or may be conformal-type vias in which the metal material is formed along a wall surface of a via hole. The redistribution vias 113 may be formed by a plating process, and may include a seed layer and a conductor layer.

The frame 120 may be directly disposed on the upper surface of the redistribution substrate 110, including a plurality of insulating layers 121a and 121b and first and second vertical connection conductors 120P1 and 120P2 penetrating the plurality of insulating layers 121a and 121b to provide an electrical connection path, and having a through-hole 120H penetrating the plurality of insulating layers 121a and 121b and accommodating the first semiconductor chip 131.

For example, the frame 120 may include a first insulating layer 121a disposed on an upper surface of the redistribution substrate 110 and a second insulating layer 121b disposed on an upper surface of the first insulating layer 121a, the first vertical connection conductor 120P1 may include a first lower wiring layer 122a1 in contact with the upper surface of the redistribution substrate 110 and embedded in the first insulating layer 121a, a first intermediate wiring layer 122b1 disposed on the upper surface of the first insulating layer 121 and embedded in the second insulating layer 121b, and a first upper wiring layer 122c1 disposed on the upper surface of the second insulating layer 121b, and the second vertical connection conductor 120P2 may include a second lower wiring layer 122a2 in contact with the upper surface of the redistribution substrate 110 and embedded in the first insulating layer 121a, a second intermediate wiring layer 122b2 disposed on the upper surface of the first insulating layer 121a and embedded in the second insulating layer 121b, and a second upper wiring layer 122c2 disposed on the upper surface of the second insulating layer 121b. The first lower wiring layer 122a1 and the first intermediate wiring layer 122b1 may be electrically connected by a first lower wiring via 123a1, and the first intermediate wiring layer 122b1 and the first upper wiring layer 122c1 may be electrically connected by a first upper wiring via 123b1. The second lower wiring layer 122a2 and the second intermediate wiring layer 122b2 may be electrically connected by a second lower wiring via 123a2, and the second intermediate wiring layer 122b2 and the second upper wiring layer 122c2 may be electrically connected by a second upper wiring via 123b2.

The first vertical connection conductor 120P1 and the second vertical connection conductor 120P2 may be spaced apart from each other. For example, a plurality of each of the first and second vertical connection conductors 120P1 and 120P2 in a plan view may be disposed to surround the through-hole 120H, and the plurality of second vertical connection conductors 120P2 may be disposed closer to the through-hole 120H than the plurality of first vertical connection conductors 120P1.

The frame 120 may improve rigidity of the package depending on the specific material of the insulating layers 121a and 121b, and may secure thickness uniformity of the encapsulant 140. The through-hole 120H may have a shape in which a wall surface surrounds the first semiconductor chip 131, for example.

A material of the insulating layers 121a and 121b may include, for example, an insulating material. In this case, the insulating material may be a thermosetting resin such as an epoxy resin, a thermoplastic resin such as a polyimide resin, a resin in which the thermosetting resin and the thermoplastic resin are mixed with an inorganic filler. For example, Ajinomoto build-up film (ABF), or the like, may be used as the insulating material. In another implementation, a material in which the resins described above are impregnated together with an inorganic filler in a core material such as a glass fiber (or a glass cloth or a glass fabric), for example, prepreg, or the like, may also be used as the insulating material.

The wiring layers 122a1, 122b1, 122c1, 122a2, 122b2, and 122c2 of the first and second vertical connection conductors 120P1 and 120P2 may provide an up and down electrical connection path of the package together with the wiring vias 123a1, 123b1, 123a2, and 123b2, and may redistribute the connection pads 131P and 132P of the first and second semiconductor chips 131 and 132. The wiring layers 122a1, 122b1, 122c1, 122a2, 122b2, and 122c2 may include copper (Cu), aluminum (Al), silver (Ag), tin (Sn), gold (Au), nickel (Ni), and lead (Pb), titanium (Ti), or alloys thereof. The wiring layers 122a1, 122b1, 122c1, 122a2, 122b2, and 122c2 may form a ground (GND) pattern, a power (PWR) pattern, and a signal (S) pattern, depending on designs of corresponding layers. The signal (S) pattern may provide various signals such as data signals and the like, other than those provided by the ground (GND) patterns and the power (PWR) patterns. The ground (GND) pattern and the power pattern (PWR) pattern may be the same patterns. The wiring layers 122a1, 122b1, 122c1, 122a2, 122b2, and 122c2 may be formed by a plating process, and may include a seed layer and a conductor layer, respectively.

The wiring vias 123a1, 123b1, 123a2, and 123b2 may electrically connect the wiring layers 122a1, 122b1, 122c1, 122a2, 122b2, and 122c2 formed on different layers to form an electrical path penetrating the frame 120 vertically. The wiring vias 123a1, 123b1, 123a2, and 123b2 may include copper (Cu), aluminum (Al), silver (Ag), tin (Sn), gold (Au), nickel (Ni), and lead (Pb), titanium (Ti), or alloys thereof. The wiring vias 123a1, 123b1, 123a2, and 123b2 may include a signal via, a power via, and a ground via, and the power via and the ground via may be the same vias. The wiring vias 123a1, 123b1, 123a2, and 123b2 may be filled-type vias filled with a metal material, respectively, or may be conformal-type vias in which the metal material is formed along a wall surface of a via hole. The wiring vias 123a1, 123b1, 123a2, and 123b2 may be formed by a plating process, and may include a seed layer and a conductor layer.

The first semiconductor chip 131 may be disposed in the through-hole 120H of the frame 120 and may have a first active surface, for example, a lower surface in FIG. 1, on which a first connection pad 131P is disposed, and a first inactive surface opposing the first active surface, for example, an upper surface in FIG. 1.

The first active surface of the first semiconductor chip 131 may be directly contact the upper surface of the redistribution substrate 110, and the first connection pad 131P may be electrically connected to the first redistribution structure 112 through the redistribution vias 113.

The first semiconductor chip 131 may include an integrated circuit (IC) in which hundreds to millions or more devices are integrated. For example, the first semiconductor chip 131 may be an application processor (AP) chip such as a central processor (for example, CPU), a graphics processor (for example, GPU), a digital signal processor, an encryption processor, a microprocessor, a microcontroller, or the like, a power management integrated circuit (PMIC), a volatile memory (for example, DRAM) chip, a non-volatile memory (for example, ROM) chip, a flash memory chip, or a logic chip.

The second semiconductor chip 132 may be disposed on an upper surface of the first semiconductor chip 131 (adjacent to the first inactive surface of the first semiconductor chip 131). The second semiconductor chip 132 may have a second active surface on which a second connection pad 132P is disposed (for example, the upper surface in FIG. 1) and a second inactive surface opposing the second active surface (for example, the lower surface in FIG. 1). The second inactive surface of the second semiconductor chip 132 may be disposed to face the first inactive surface of the first semiconductor chip 131. The second connection pad 132P of the second semiconductor chip 132 may be electrically connected to the second vertical connection conductor 120P2 by a conductive wire W.

The second semiconductor chip 132 may, for example, serve to assist in a function of the first semiconductor chip 131, for example, by separating some integrated circuits of the first semiconductor chip 131. In another implementation, the second semiconductor chip 132 may include, for example, an application processor chip, a memory chip, and the like, as in the first semiconductor chip 131 described above.

An attachment member having adhesiveness may be provided between the first semiconductor chip 131 and the second semiconductor chip 132. A bonding surface between the first semiconductor chip 131 and the second semiconductor chip 132 may be at the same level as the upper surface of the frame 120 or higher.

A thickness t1 of the first semiconductor chip 131 may be equal to or greater than a thickness t2 of the second semiconductor chip 132. A width $\ell 1$ of the first semiconductor chip 131 may be equal to or greater than a width $\ell 2$ of the second semiconductor chip 132. The second inactive surface of the second semiconductor chip 132 may be located at a level that is higher than the upper surface of the frame 120.

The frame 120 may have a height corresponding to the thickness t1 of the first semiconductor chip 131. For example, the thickness t1 of the first semiconductor chip 131 may be about 0.05 mm to 0.45 mm, and the thickness t2 of the second semiconductor chip 132 may be about 0.03 mm to 0.4 mm.

The thickness of the frame 120 may be greater or less than the thickness of the first semiconductor chip 131, for example, the thickness of the frame 120 and the thickness of the first semiconductor chip 131 may have a difference in a range of 0.25 mm to 0.02 mm. The widths $\ell 1$ and $\ell 2$ of each of the first semiconductor chip 131 and the second semiconductor chip 132 may be about 0.5 mm to 50 mm. The widths ℓ1 and ℓ2 may include, in plan view, a horizontal width and a vertical width of the semiconductor chips.

The overall thickness of the package may be about 0.15 mm to 0.8 mm. The thickness of the lower package (including the frame 120, the redistribution substrate 110, and the first passivation layer 161 under the redistribution substrate 110) may be about 0.1. mm to 0.5 mm. The thickness of the upper package (including the encapsulant 140 and the second passivation layer 162) may be about 0.05 mm to 0.3 mm. The height of the vertical connection via 153 penetrating a portion of the encapsulant 140 may be about 0.05 mm to 0.25 mm.

The first semiconductor chip 131 and the second semiconductor chip 132, stacked up and down, may be electrically connected to the redistribution substrate 110 of the package in different ways in order to reduce the size of the package and realize high performance of the package. For example, the first semiconductor chip 131 disposed below may be directly contact the upper surface of the redistribution substrate 110 and be connected to the redistribution layer 112 through the redistribution vias 113, and the second semiconductor chip 132 disposed above may be connected to the redistribution layer 112 through the conductive wire W and the second vertical connection conductor 120P2 surrounding a periphery of the first semiconductor chip 131.

According to the present example embodiment, rigidity of the package may be secured by the frame 120 having the through-hole 120H that accommodates the first semiconductor chip 131. Further, it may be possible to secure a process margin and improve a yield in an attachment or an alignment process of the semiconductor chip by varying the heights and widths of the first semiconductor chip 131 and the second semiconductor chip 132.

As shown in FIG. 1, a side surface of the first semiconductor chip 131 may have a step from a side surface of the second semiconductor chip 132. As shown in FIG. 2, in a plan view, the second semiconductor chip 132 may overlap the first semiconductor chip 131 and the side surface of the second semiconductor chip 132 may be spaced apart from the side surface of the first semiconductor chip 131.

The encapsulant 140 may be disposed on the redistribution substrate 110, and may encapsulate at least a portion of the frame 120, the first semiconductor chip 131, and the second semiconductor chip 132. The encapsulant 140 may include an insulating material. As the insulating material, a material including an inorganic filler and an insulating resin, for example, a thermosetting resin such as an epoxy resin, a thermoplastic resin such as polyimide, or a resin in which a reinforcing material such as an inorganic filler is included therein, for example, ABF, FR-4, BT, resin, and the like, may be used. A molding material such as EMC or a photosensitive material such as PIE (Photo Imageable Encapsulant) may be used.

The second redistribution structure 152 may be disposed on the upper surface of the encapsulant 140, and may be electrically connected to the first vertical connection conductor 120P1 through a vertical connection via 153 penetrating a portion of the encapsulant 140. The second redistribution structure 152 may include a pad portion 152p located in an opening 162h of the passivation layer 162 and a pattern portion 152i extending from the pad portion 152p. In the drawing, unlike the pad portion 152p, the pattern portion 152i and the pad portion 152p are illustrated together to show the difference covered by the passivation layer 162, but according to a cutting surface of the package, the pattern portion 152i may not be visible.

The pad portion 152p may be directly connected to the connection bump in the package-on-package combination, and may have a circular or square shape having a diameter that is greater than the line width of the pattern portion 152i. The shape of the pad portion 152p may be varied.

The pattern portion 152i may be a circuit pattern extending on the encapsulant 140. One end of the pattern portion 152i may be connected to the pad portion 152p and another end of the pattern portion 152i may be connected to the vertical connection via 153.

A surface layer 154 may be disposed on the second redistribution structure 152, and at least a portion of the surface layer 154 may be covered by the passivation layer 162. The surface layer 154 may be disposed on the pad portion 152p of the second redistribution structure 152, and the passivation layer 162 may have an opening 162h exposing at least a portion of the surface layer 154. The width of the pad portion 152p of the second redistribution structure 152 may be greater than the width of the surface layer 154.

The second redistribution structure 152 may provide an electrical circuit on a back surface of the package 100A, for example, on the upper surface in FIG. 1. The second redistribution structure 152 may include a conductive material. For example, the conductive material may include copper (Cu), aluminum (Al), silver (Ag), tin (Sn), gold (Au), nickel (Ni), lead (Pb), titanium (Ti), or alloys thereof. The second redistribution structure 152 may perform various functions depending on the design. For example, the second redistribution structure 152 may include a ground (GND) pattern, a power (PWR) pattern, or a signal (S) pattern. The second redistribution structure 152 may be formed by a plating process, and may include a seed layer and a conductor layer.

As shown in FIG. 1, the package 100A may further include a first passivation layer 161. The first passivation layer 161 may be disposed on an opposite surface of the redistribution substrate 110 relative to the surface on which the frame 120 is disposed.

The first passivation layer 161 may have a first opening 161h that exposes at least a portion of the first redistribution structure 112, an under bump metal (UBM) 170 disposed on the under bump metal 170, a connection bump 180 covering the under bump metal 170, and a second passivation layer 162 disposed on the encapsulant 140. The first passivation layer 161 may have a second opening 162h that exposes at least a portion of the second redistribution structure 152. At least a portion of each of the first and second openings 161h and 162h may be vertically formed in a position not overlapping the first semiconductor chip 131, that is, in a fan-out region.

The passivation layers 161 and 162 may include an insulating material, for example, ABF, and may include other types of insulating materials.

The under bump metal (UBM) 170 may be disposed in the opening 161h of the first passivation layer 161 and may be electrically connected to a portion of the first redistribution structure 112 exposed by the opening 161h. The under bump metal 170 may improve connection reliability of the connection bump 180 and board level reliability of the package 100A. The under bump metal 170 may be formed by a metallization method using metal, for example.

The connection bump 180 may physically and/or electrically connect the semiconductor package 100A to the outside. The connection bump 180 may include a low-melting point metal, for example, tin (Sn) or an alloy (for example Sn—Ag—Cu) including tin (Sn). The connection bump 180 may be a land, a ball, or a pin. The connection bump 180 may include a copper pillar or solder. At least one of the connection bumps 180 may be disposed in the fan-out region, that is, in a region that does not vertically overlap a region in which the first semiconductor chip 131 is disposed.

FIGS. 3A to 3F are cross-sectional views schematically illustrating a method of manufacturing the semiconductor package 100A of FIG. 1.

Figure 3A:
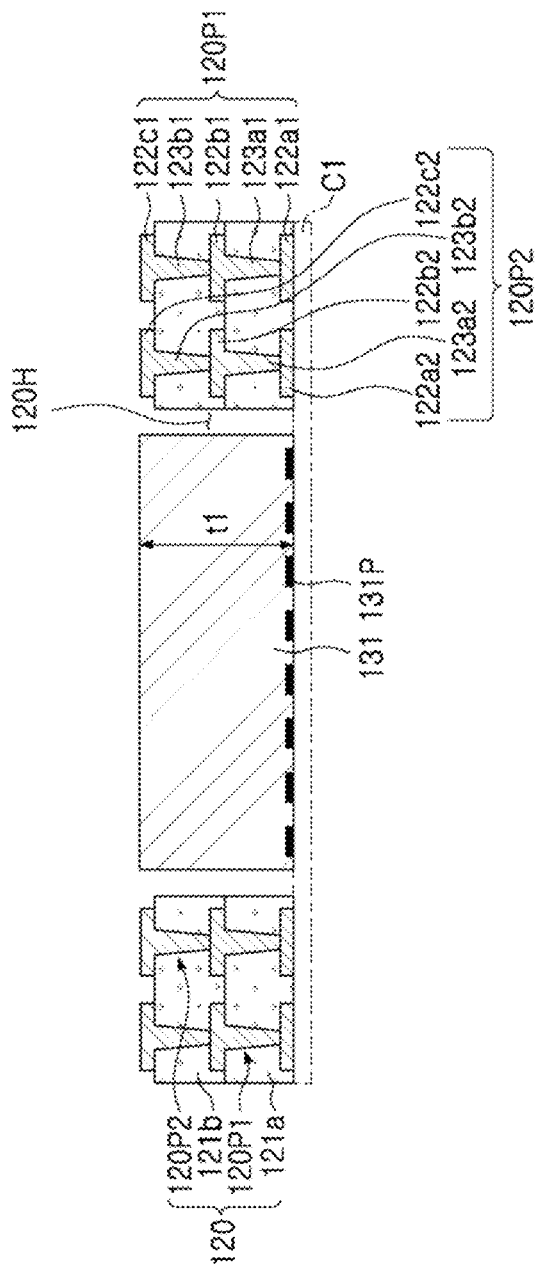
FIGS. 3A to 3F are cross-sectional views schematically showing a method of manufacturing the semiconductor package of FIG. 1.

Referring to FIG. 3A, a frame 120 having a through-hole 120H may be disposed on a first carrier C1, and a first semiconductor chip 131 may be disposed in the through-hole 120H.

The first semiconductor chip 131 may be disposed such that the active surface on which the connection pad 131P is disposed contacts the first carrier C1.

The frame 120 may include first and second insulating layers 121*a* and 121*b*, and first and second vertical connection conductors 120P1 and 120P2. A thickness t1 of the first semiconductor chip 131 may such that an upper surface thereof in FIG. 3A is at the same level as that of an upper extent or height of the frame 120. The first carrier C1 may include a structure including an organic material and double-sided tape, for example.

Figure 3B:
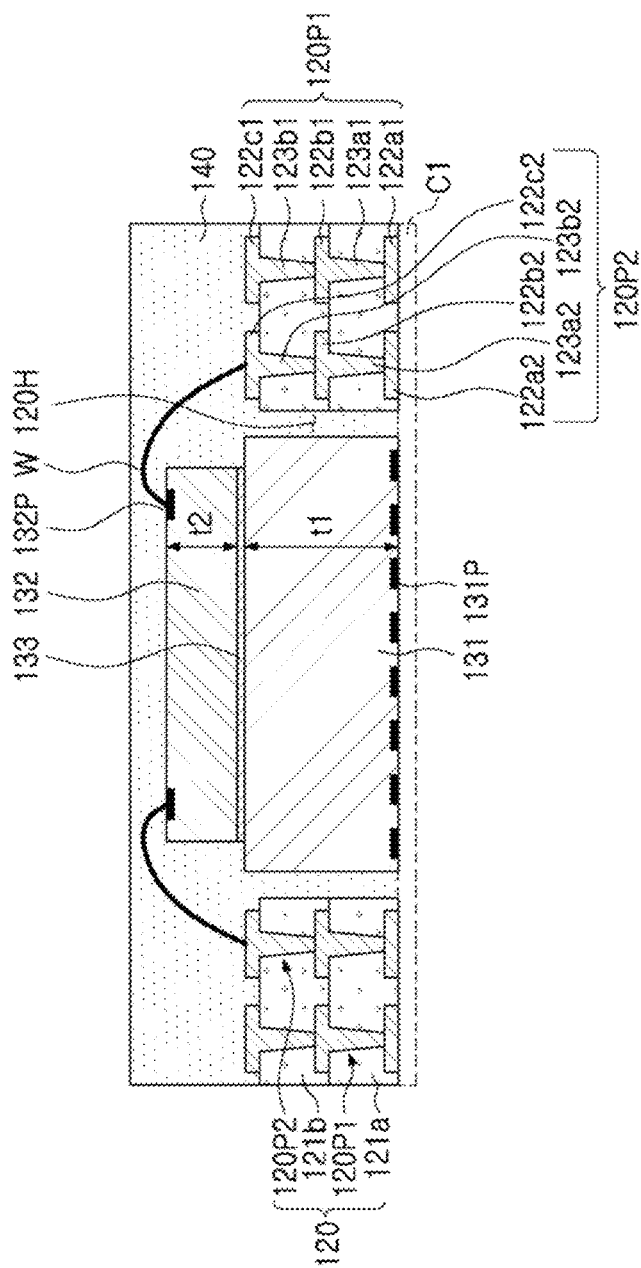

Referring to FIG. 3B, a second semiconductor chip 132 may be disposed on the first semiconductor chip 131. The second semiconductor chip 132 may be disposed in a face up position such that the active surface (on which the connection pad 132P is disposed) faces upward.

A thickness t2 of the second semiconductor chip 132 may be smaller than the thickness t1 of the first semiconductor chip 131.

The connection pad 132P of the second semiconductor chip 132 may be electrically connected to the second vertical connection conductor 120P2 using a conductive wire W. An encapsulant 130 may be formed to fill a space between the frame 120 and the first semiconductor chip 131, and cover the upper surfaces of the first semiconductor chip 131 and the second semiconductor chip 132. As the encapsulant 140, a suitable material for a molding process of a semiconductor package may be used.

Figure 3C:
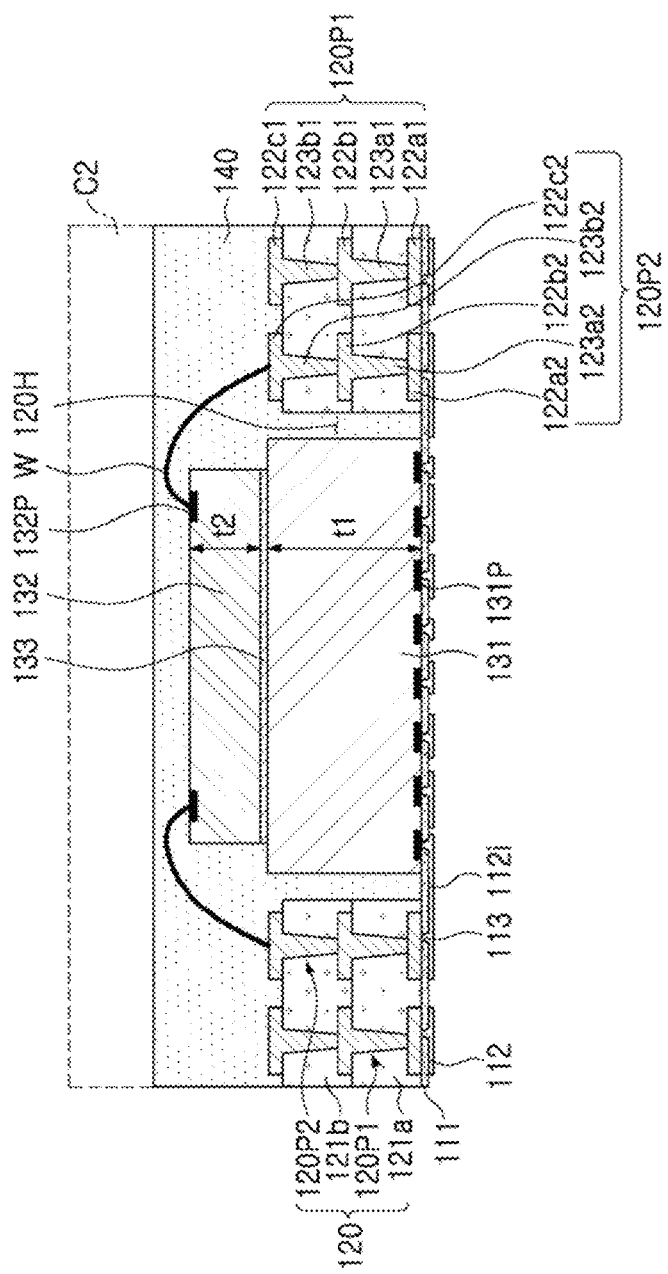

Referring to FIG. 3C, a second carrier C2 may be disposed on the encapsulant 140. The first carrier C1 may be removed.

An insulating layer 111, a redistribution layer, a first redistribution structure 112, or a redistribution via 113 may be formed on a surface from which the first carrier C1 is removed.

The redistribution layer may include a connection pattern portion 112*i* electrically connecting the first connection pad 131P and the second vertical connection conductor 120P2 via a region that is not shown in, for example, out of the plane of, the cross-section of FIG. 3C. The insulating layer 111 may include a PID, and a via hole penetrating the insulating layer 111 may be formed by a photolithography process. The redistribution layer 112 and the redistribution via 113 may be formed by a plating process.

Figure 3D:
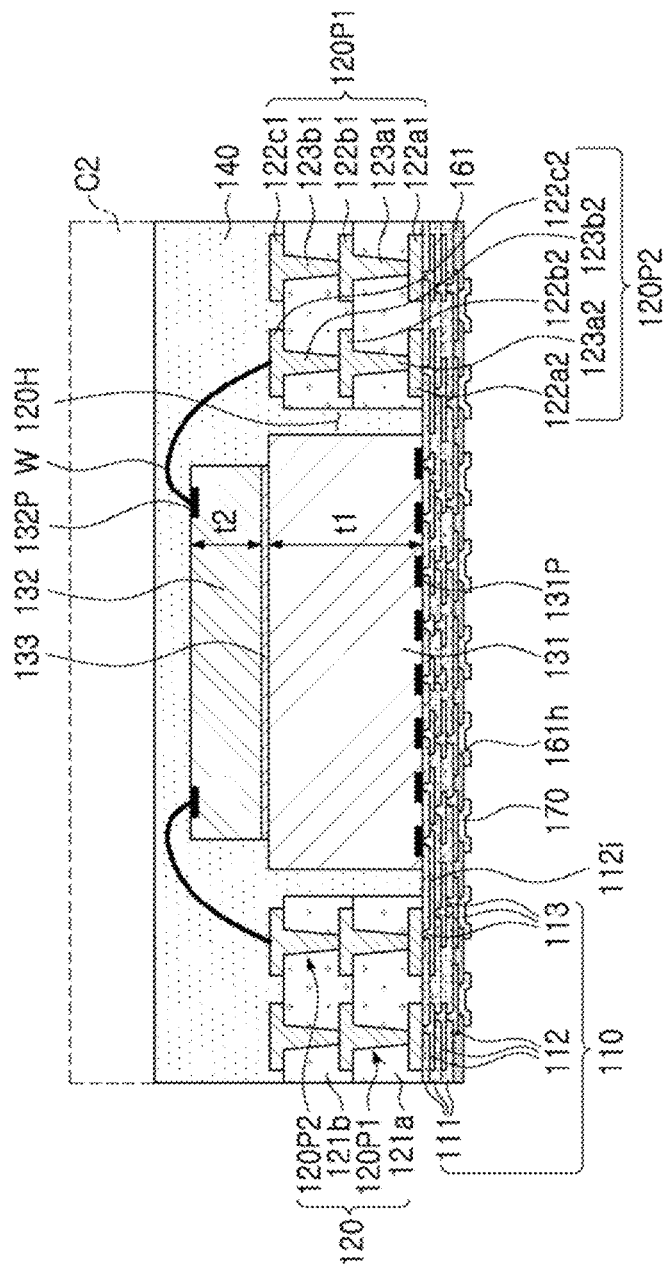

Referring to FIG. 3D, a process of forming the insulating layer 111, the redistribution layer 112, and the redistribution via 113 (see FIG. 3B) may be repeated to form a redistribution substrate 110 including a plurality of insulating layers 111, a plurality of redistribution layers 112, and a plurality of redistribution vias of 113. A first passivation layer 161 having an opening 161*h* exposing a portion of an outermost redistribution layer 112 may be formed on the redistribution substrate 110, and an under bump metal (UBM) 170 may be formed such that it is connected to the outermost redistribution layer 112 exposed through the opening 161*h*.

Figure 3E:
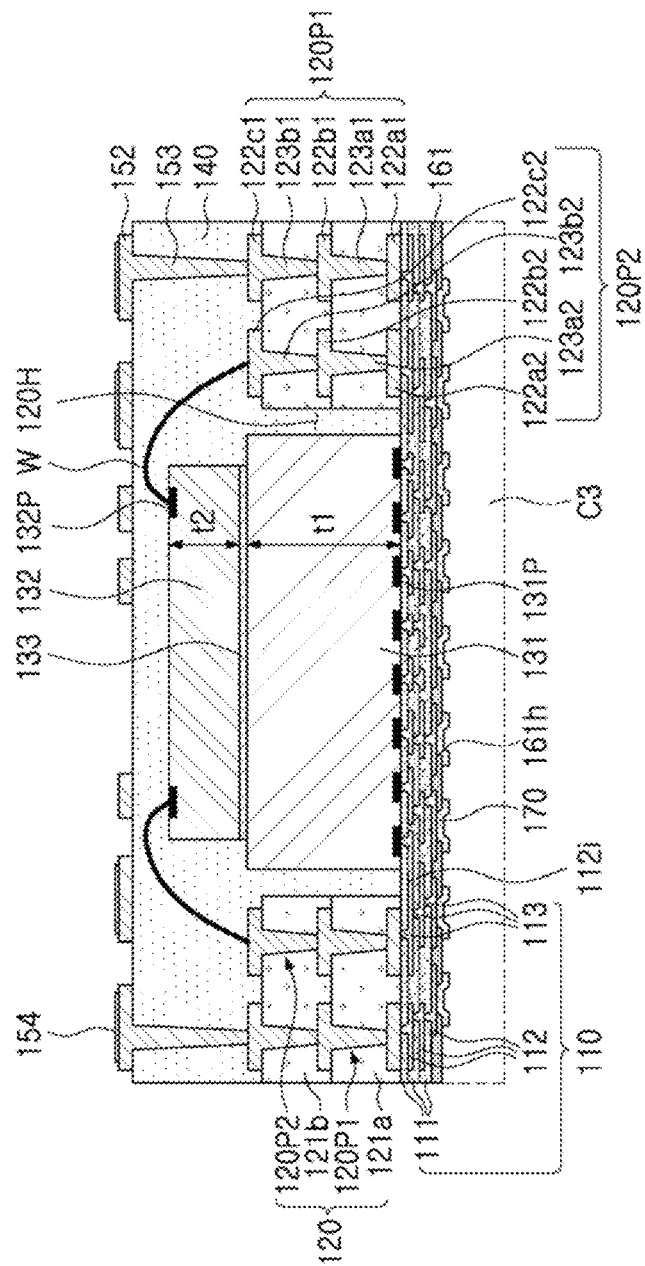

Referring to FIG. 3E, a lower surface of the first passivation layer 161 may be attached to a third carrier C3, and the second carrier C2 may be removed to expose the upper surface of the encapsulant 140.

The vertical connection via 153 may be formed to penetrate an upper portion of the exposed encapsulant 140. Next may be formed the second redistribution layer or the second redistribution structure 152, disposed on the upper surface of the exposed encapsulant 140. The second redistribution structure 152, the vertical connection via 153, and the surface layer 154 may be formed by a plating process.

Figure 3F:
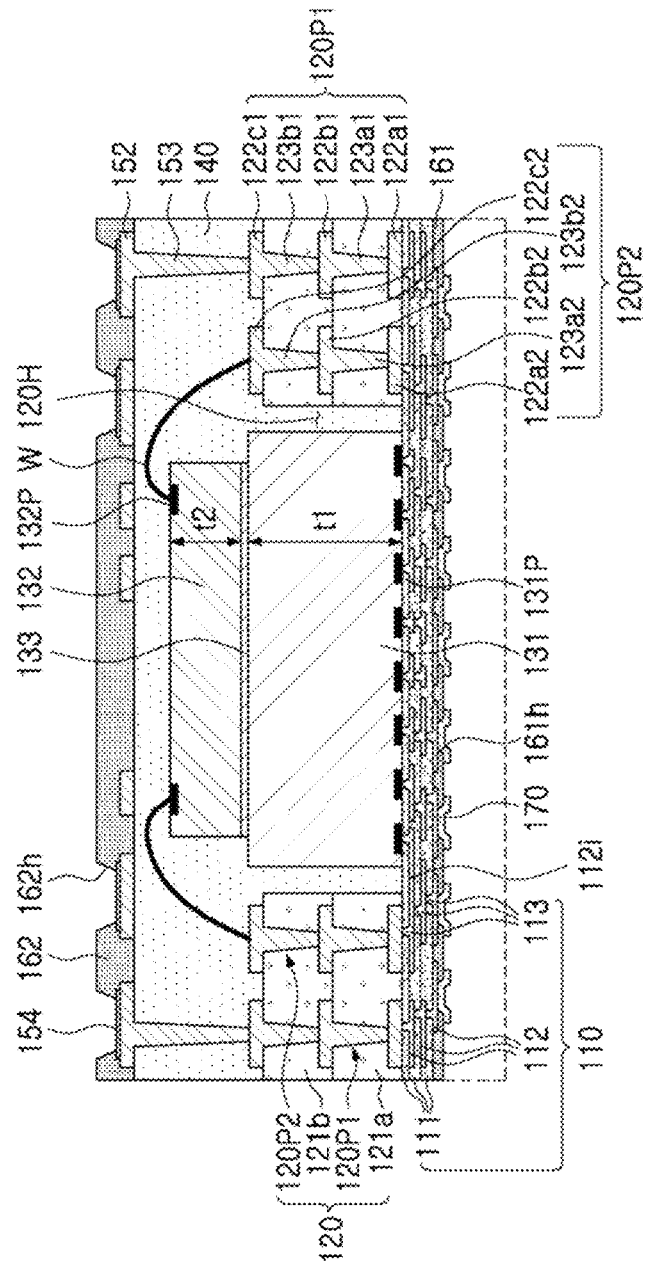

Referring to FIG. 3F, a second passivation layer 162 covering the upper surface of the encapsulant 140 may be formed. The second passivation layer 162 may have an opening 162*h* exposing a portion of the surface layer 154 formed in the pad portion of the second redistribution structure 152. The pattern portion of the second redistribution structure 152 may be completely covered by the second passivation layer 162. The second passivation layer 162 may be a solder resist, and the opening 162*h* may be formed by a laser drill.

Figure 4:
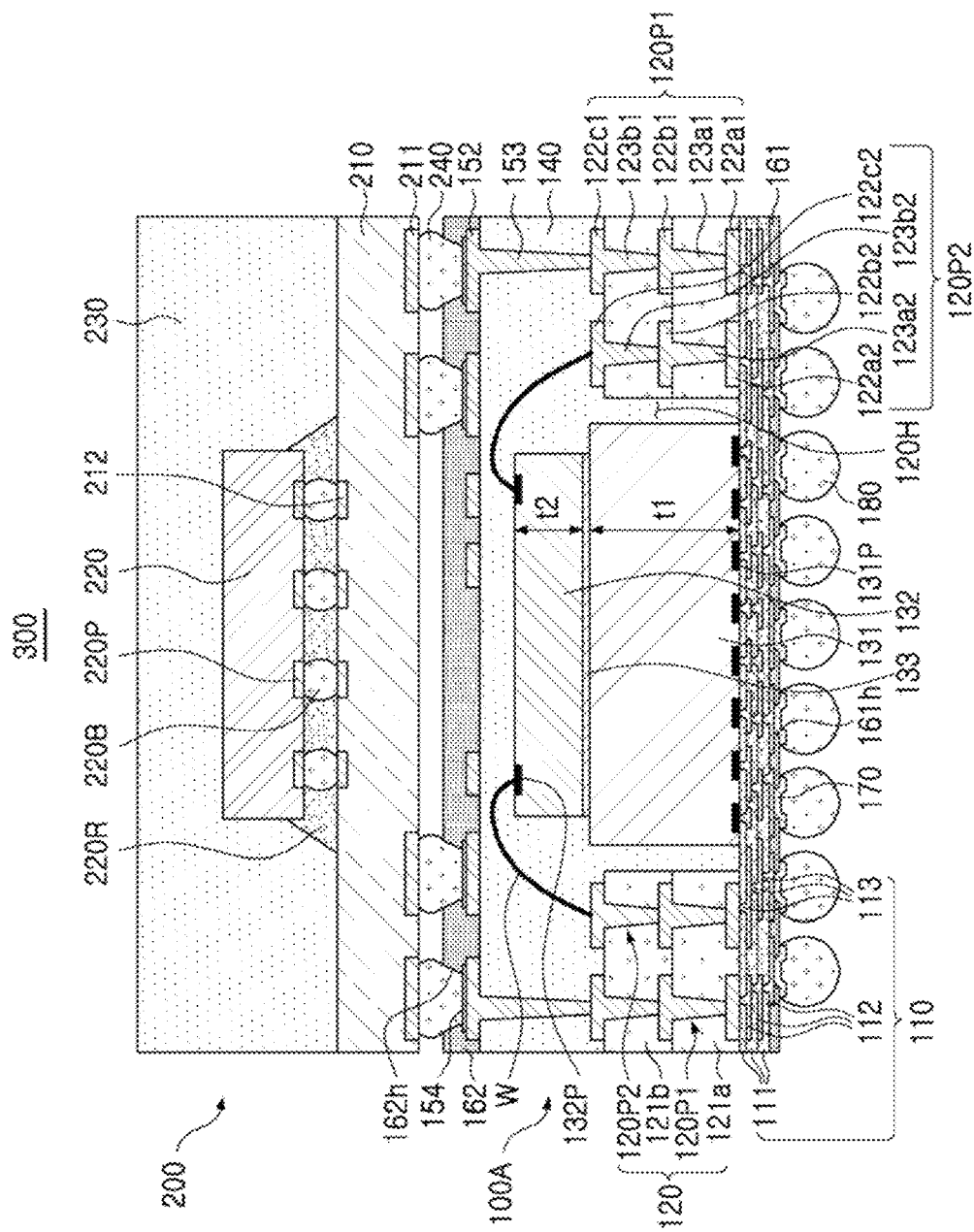
FIG. 4 is a cross-sectional view illustrating a semiconductor package according to another example embodiment.

FIG. 4 is a cross-sectional view illustrating a semiconductor package 300 according to another example embodiment. Among the components shown in FIG. 4, components having the same reference numbers as in FIG. 1 have similar technical characteristics to those shown in FIG. 1, and thus descriptions thereof may be briefly restated or omitted.

Referring to FIG. 4, the semiconductor package 300 may have a package-on-package structure in which the second semiconductor package 200 is coupled onto the first semiconductor package 100A of FIG. 1. The second package 200 may include a redistribution member 210, a semiconductor chip 220, and an encapsulating member 230. The first semiconductor package 100A may be replaced with a semiconductor package according to other example embodiments described below.

The redistribution member 210 may include redistribution pads 211 and 212 electrically connected to the outside on the lower surface and the upper surface of the redistribution member 210, respectively. The redistribution member 210 may include therein redistribution patterns that are connected to the redistribution pads 211 and 212. The redistribution patterns may redistribute a connection pad 220P of the semiconductor chip 220 to the fan-out region.

The semiconductor chip 220 may include a connection pad 220P connected to an internal integrated circuit. The connection pad 220P may be electrically connected to the redistribution member 210 by a metal bump 220B. The second package 200 may further include an underfill material 220R surrounding a metal bump 220B. The underfill material 220R may be an insulating material including an epoxy resin, or the like. The metal bump 220B may include a solder ball or a copper pillar.

Different from what is shown in the drawing, in an example embodiment, the connection pad 220P of the semiconductor chip 220 may directly contact the upper surface of the redistribution member 210, and may be electrically connected to the redistribution patterns through the vias in the redistribution member 210.

The encapsulating member 230 may include the same or similar material to the encapsulant 140 of the semiconductor package 100A.

The second package 200 may be physically and electrically connected to the semiconductor package 100A by a connection bump 240. The connection bump 240 may be electrically connected to the redistribution patterns in the redistribution member 210 through the redistribution pad 211 on the lower surface of the redistribution member 210. In another implementation, the connection bump 240 may be electrically connected to the redistribution patterns 210 through an under bump metal disposed on the redistribution pad 211 on the lower surface of the redistribution member 210. The connection bump 240 may be made of a low melting point metal, for example, tin (Sn) or an alloy containing tin (Sn).

The semiconductor package 300 may include a lower semiconductor package 100A, an upper semiconductor package 200 on the lower semiconductor package 100A, and a connection bump 240 electrically connecting the lower semiconductor package 100A and the upper semiconductor package 200. The lower semiconductor package 100A may include a redistribution substrate 110 including a first redistribution structure 112, a frame 120 disposed on the redistribution substrate 110, including first and second vertical connection conductors 120P1 and 120P2 electrically connected to the first redistribution structure 112, and having a through-hole 120H, a first semiconductor chip disposed in the through-hole 120H, and including a first connection pad 131P electrically connected to the first vertical connection conductor 120P1 through the first redistribution structure 112, a second semiconductor chip 132 disposed on an upper surface of the first semiconductor chip 131, and including a second connection pad 132P electrically connected to the second vertical connection conductor 120P2 through a conductive wire W, an encapsulant encapsulating at least a portion of the frame 120, the first semiconductor chip 131, and the second semiconductor chip 132, and a second redistribution structure 152 disposed on the encapsulant 140, and electrically connected to the first vertical connection conductor 120P1. The upper semiconductor package 200 may include a redistribution member 210 including redistribution pads 211 and 212 electrically connected to the second redistribution structure 152, a third semiconductor chip 220 disposed on the redistribution member 210 and electrically connected to the redistribution pads 211 and 212, and an encapsulating member 230 encapsulating the third semiconductor chip 220. The thickness t1 of the first semiconductor chip 131 may be greater than the thickness t2 of the second semiconductor chip 132, the width of the first semiconductor chip 131 may be greater than the width of the second semiconductor chip 132, and the upper surface of the second semiconductor chip 132 may be located at a level that is higher than the upper surface of the frame 120.

Figure 5:
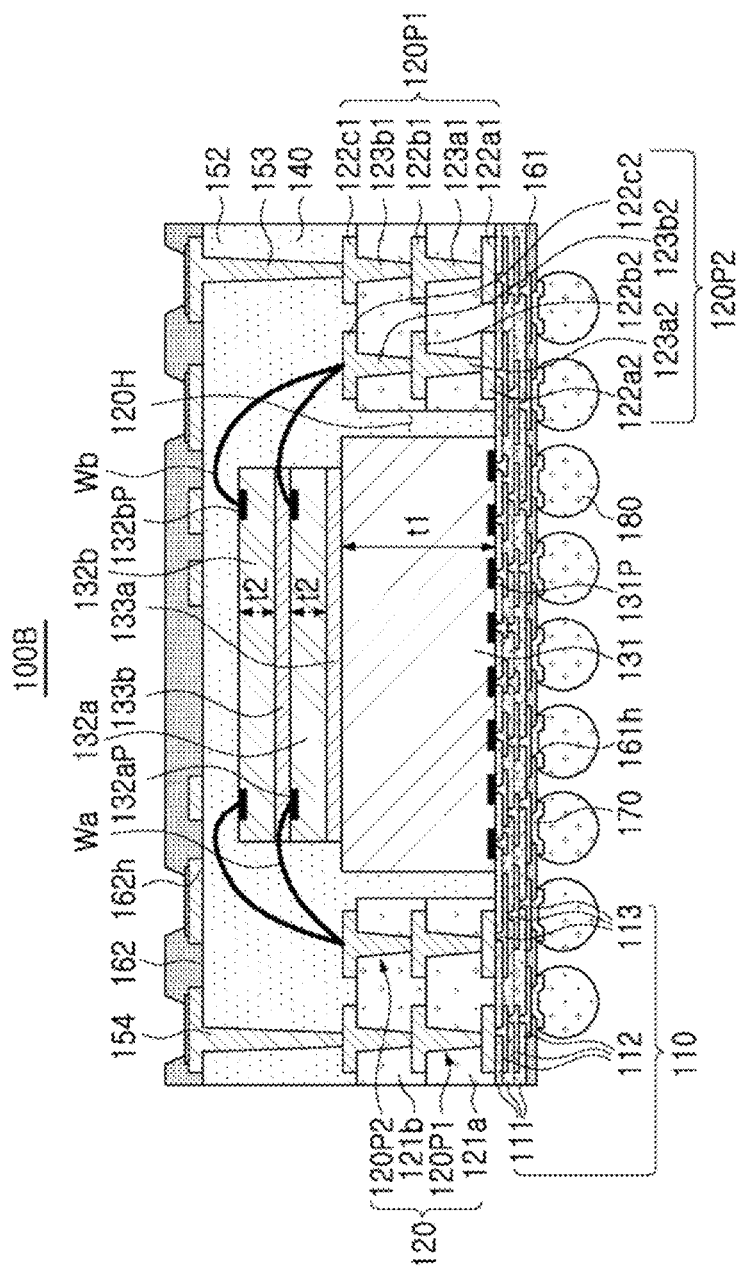
FIG. 5 is a cross-sectional view illustrating a semiconductor package according to another example embodiment.
Figure 6:
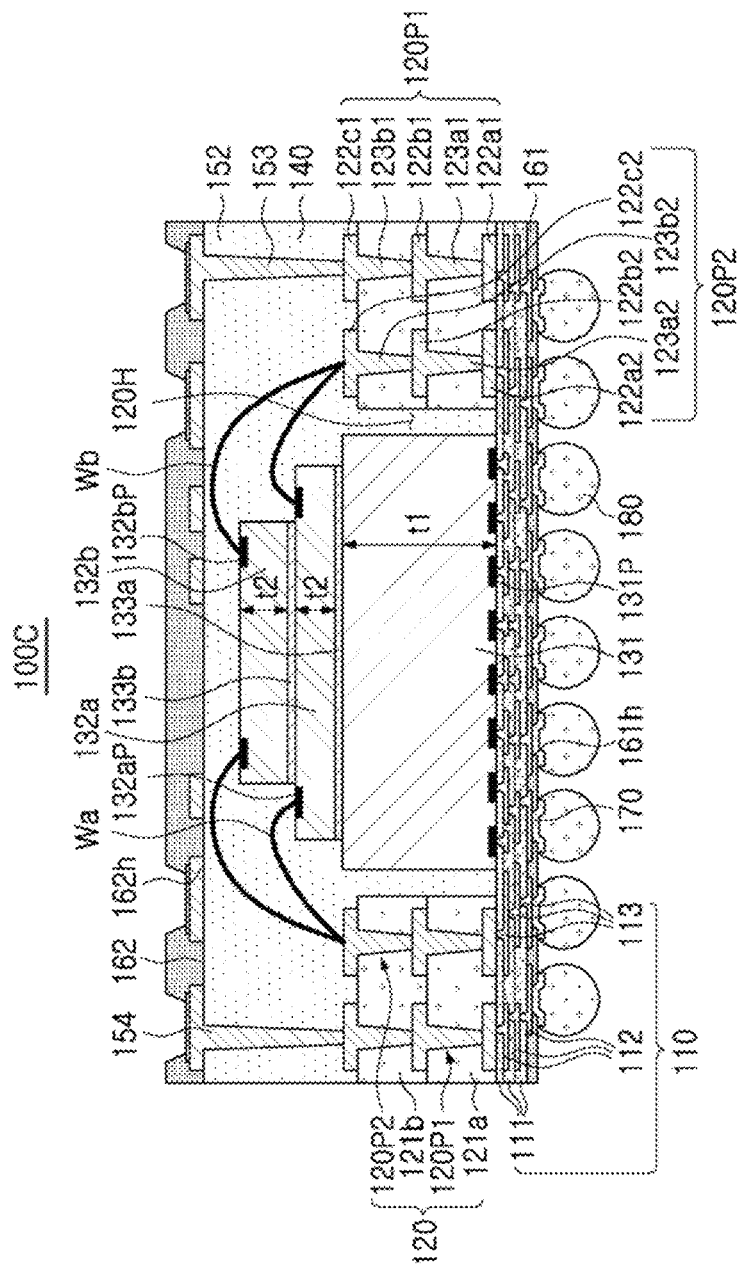
FIG. 6 is a cross-sectional view illustrating a semiconductor package according to another example embodiment.

FIGS. 5 and 6 are cross-sectional views showing semiconductor packages 100B and 100C according to another example embodiment. Among the components shown in FIGS. 5 and 6, components having the same reference numbers as in FIG. 1 have similar technical characteristics to those shown in FIG. 1, and thus descriptions thereof may be briefly restated or omitted.

Referring to FIG. 5, a semiconductor package 100B may include a plurality of second semiconductor chips 132a and 132b. The plurality of second semiconductor chips 132a and 132b may be stacked in a direction that is perpendicular to the inactive surface of the first semiconductor chip 131. The second semiconductor chips 132a and 132b may be the same or different types of chips. Each of the plurality of second semiconductor chips 132a and 132b may have the same width as the other. For example, the plurality of second semiconductor chips 132a and 132b may be chips of the same type, and a thickness t2 of each of the plurality of second semiconductor chips 132a and 132b may be the same as each other. An upper surface of the second semiconductor chip 132a may be located at a level that is higher than the upper surface of the frame 120. The thickness t1 of the first semiconductor chip 131 may be about 0.05 mm to 0.45 mm, and the thickness t2 of the second semiconductor chip 132 may be about 0.03 mm to 0.2 mm.

Referring to FIG. 6, a semiconductor package 100C may include a plurality of second semiconductor chips 132a and 132b. The plurality of second semiconductor chips 132a and 132b may be stacked in a direction that is perpendicular to the inactive surface of the first semiconductor chip 131. The second semiconductor chips 132a and 132b may be chips of the same type or different types of chips to each other. The plurality of second semiconductor chips 132a and 132b may have a relatively smaller width as they are positioned farther away from the inactive surface of the first semiconductor chip 131.

As shown in FIGS. 5 and 6, the plurality of second semiconductor chips 132a and 132b may be connected to a second vertical connection conductor 120P2 by conductive wires Wa and Wb, respectively. A connection pad 132aP of the lower second semiconductor chip 132a may be connected to an upper wiring layer 122c2 of the second vertical connection conductor 120P2 by the first conductive wire Wa. A connection pad 132aP of the upper second semiconductor chip 132b may be connected to an upper wiring layer 122c2 of the second vertical connection conductor 120P2 by the second conductive wire Wb. Different from that shown in FIGS. 5 and 6, the connection pads 132aP and 132bP of the upper chip and the lower chip may be connected to respective ones of the upper wiring layers 122c2 that are spaced apart from each other on the upper surface of the second insulating layer 121b. A plurality of second vertical connection conductors 120P2 may be provided to correspond to the number of I/O terminals of the plurality of second semiconductor chips 132a and 132b.

Figure 7:
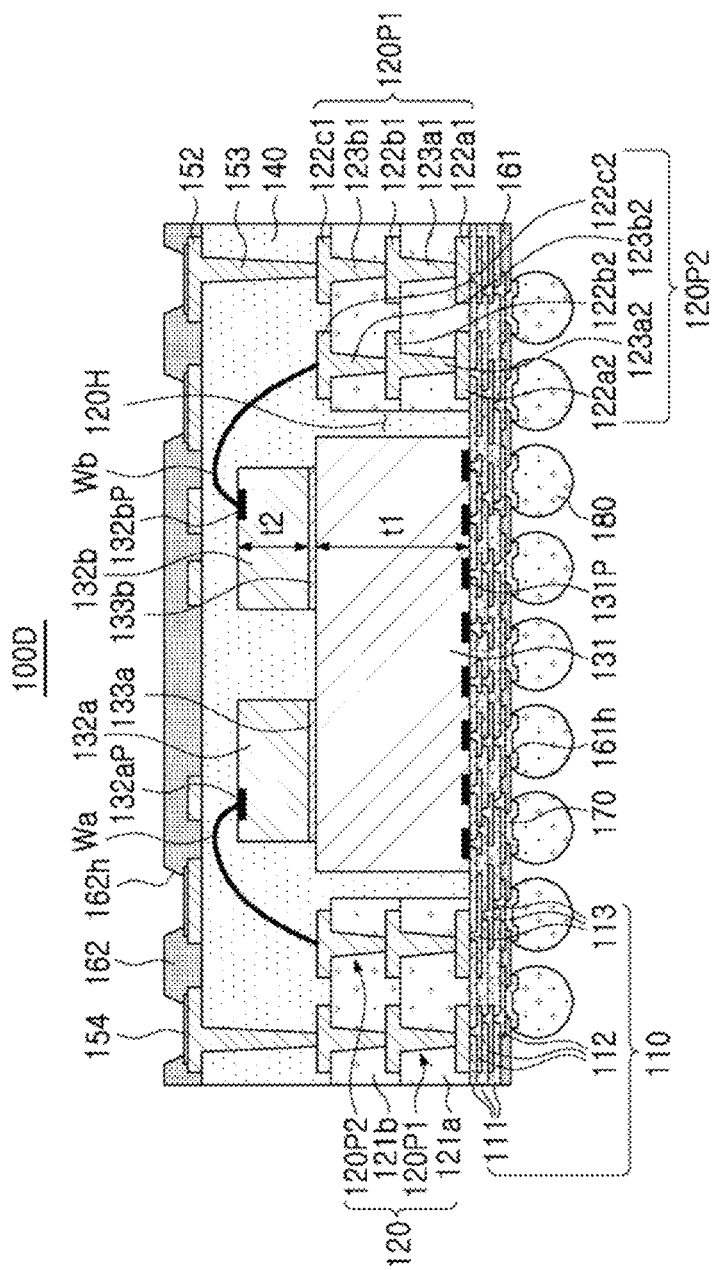
FIG. 7 is a cross-sectional view illustrating a semiconductor package according to another example embodiment.

FIG. 7 is a cross-sectional view illustrating a semiconductor package 100D according to another example embodiment. Among the components shown in FIG. 7, components having the same reference numbers as in FIG. 1 have similar technical characteristics to those shown in FIG. 1, and thus descriptions thereof may be briefly restated or omitted.

Referring to FIG. 7, the semiconductor package 100D may include a plurality of second semiconductor chips 132a and 132b. The plurality of second semiconductor chips 132a and 132b may be disposed on the first inactive surface of the first semiconductor chip 131, and may be spaced apart from each other. The second semiconductor chips 132a and 132b may be chips of the same type or different types of chips from each other. Each of the plurality of second semiconductor chips 132a and 1322b may have the same width as each other. For example, the thickness t2 of each of the plurality of second semiconductor chips 132a and 132b may be the same as each other. The plurality of second semiconductor chips 132a and 132b may be connected to the second vertical connection conductor 120P2 by conductive wires Wa and Wb, respectively.

Figure 8:
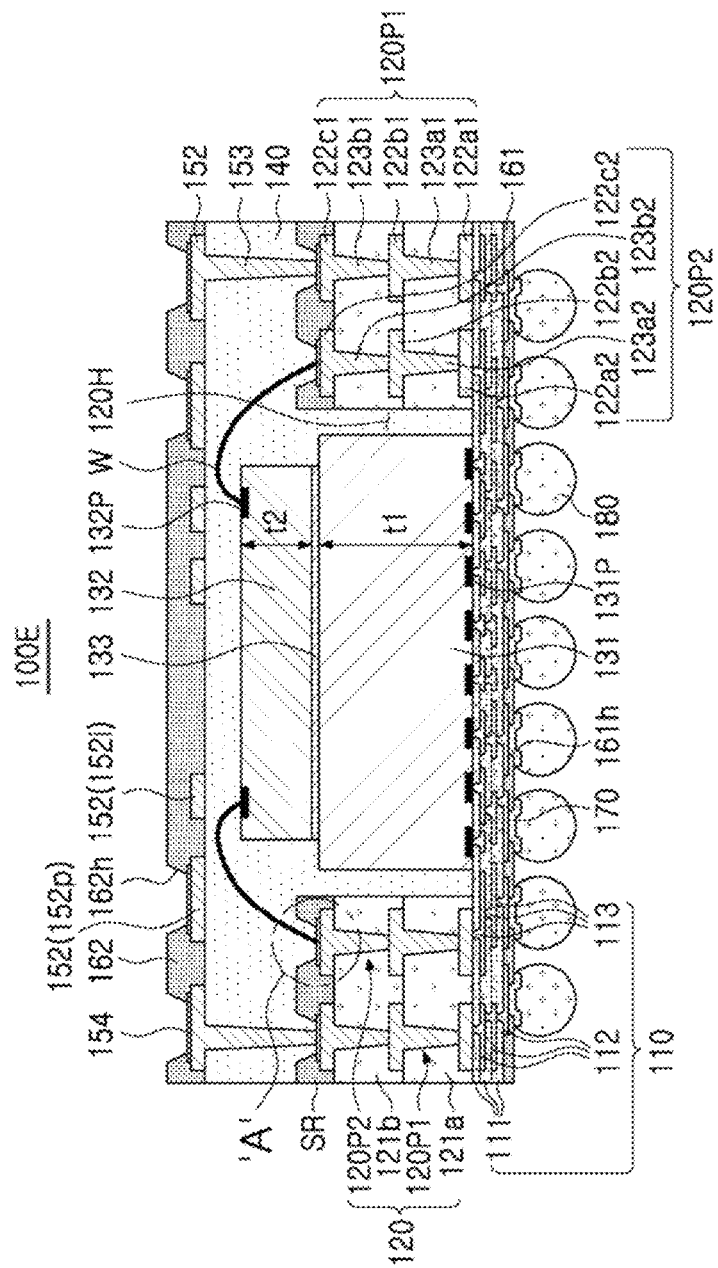
FIG. 8 is a cross-sectional view illustrating a semiconductor package according to another example embodiment.
Figure 9A:
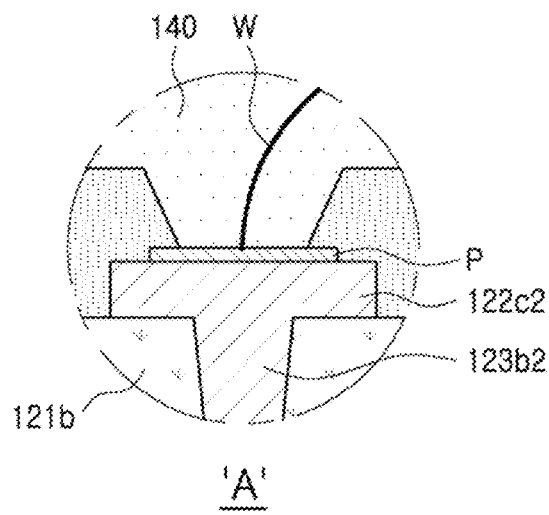
FIGS. 9A and 9B are cross-sectional views showing some elements of region "A" in FIG. 8.
Figure 9B:
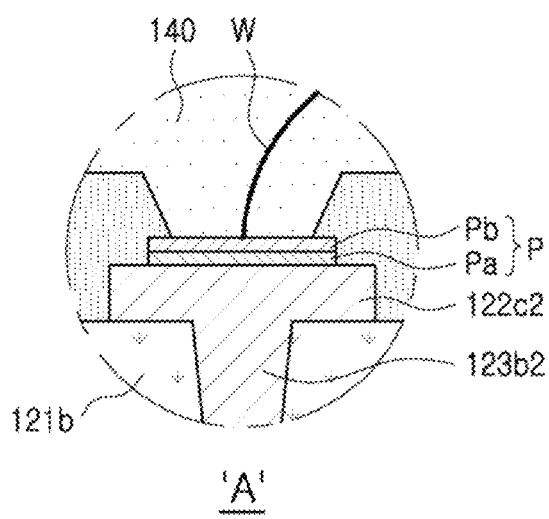

FIG. 8 is a cross-sectional view illustrating a semiconductor package 100E according to another example embodiment, and FIGS. 9A and 9B are cross-sectional views illustrating some elements of region 'A' of FIG. 8. Among the components illustrated in FIGS. 8 to 9B, components having the same reference numerals as in FIG. 1 have similar technical characteristics to components illustrated in FIG. 1, and thus descriptions thereof may be briefly restated or omitted.

Referring to FIG. 8, the semiconductor package 100E may include a resist layer SR disposed on the second insulating layer 121b and covering a portion of each of the first upper wiring layer 122c1 and the second upper wiring layer 122c2. The resist layer SR may cover a portion of uppermost surfaces of each of the first and second vertical connection conductors 120P1 and 120P2. An upper surface of the resist layer SR may be at a level higher than the lower surface of the second semiconductor chip 132 and higher than interfaces between the first semiconductor chip 131 and the second semiconductor chip 132. The resist layer SR may be a general solder resist layer, and may have an opening exposing a portion of the uppermost surfaces of each of the first and second vertical connection conductors 120P1 and 120P2.

Referring to FIGS. 9A and 9B, the first and second vertical connection conductors 120P1 and 120P2 may further include a surface layer P on the first upper wiring layer 122c1 and the second upper wiring layer 122c2, respectively. The surface layer P may be a single layer P including nickel (Ni) or a multi-layer Pa and Pb including nickel (Ni) and gold (Au). A width of the surface layer P may be smaller than widths of each of the first upper wiring layer 122c1 and the second upper wiring layer 122c2, and the resist layer SR may cover a portion of the surface layer P.

Figure 10:
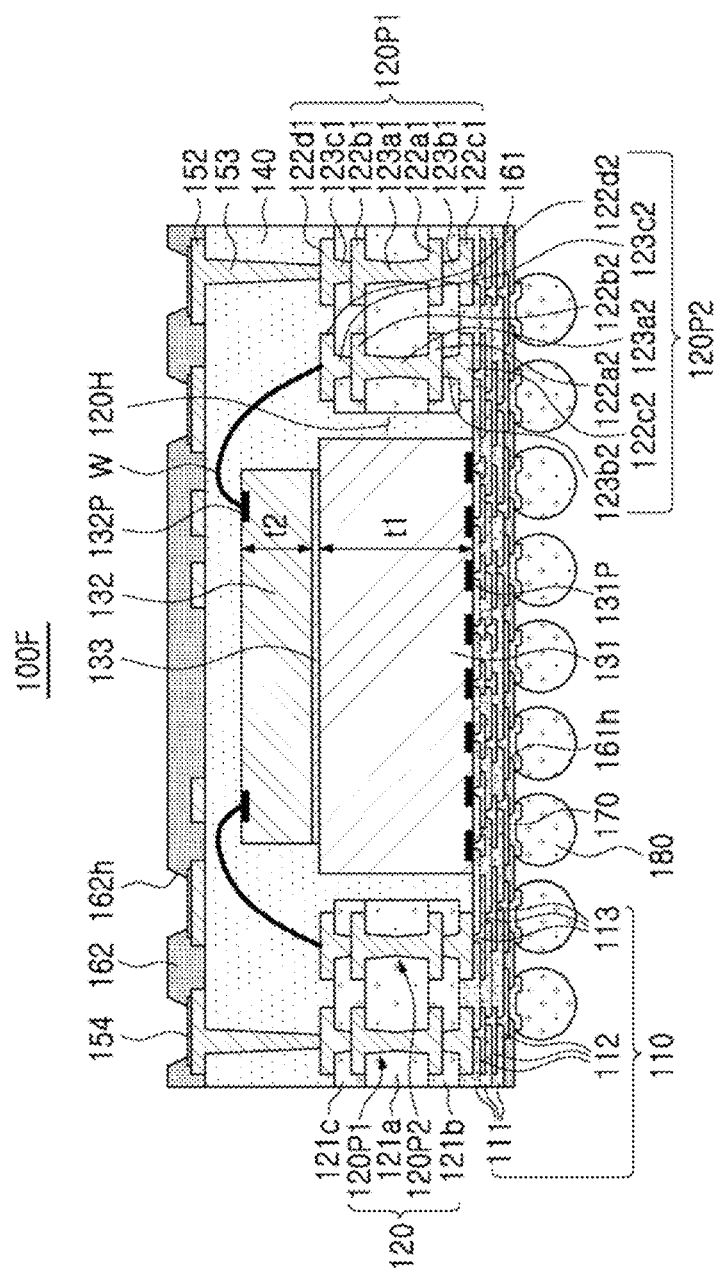
FIG. 10 is a cross-sectional view illustrating a semiconductor package according to another example embodiment.

FIG. 10 is a cross-sectional view illustrating a semiconductor package 100F according to another example embodiment. Among the components shown in FIG. 10, components having the same reference numerals as in FIG. 1 have similar technical characteristics to those shown in FIG. 1, and thus descriptions thereof may be briefly restated or omitted.

Referring to FIG. 10, in the semiconductor package 100F, the frame 120 may include first to third insulating layers 121a, 121b, and 121c and first and second vertical connection conductors 120P1 and 120P2 penetrating the first to third insulating layers 121a, 121b, and 121c to provide an electrical connection path. For example, the first vertical connection conductor 120P1 may include a pair of first intermediate wiring layers 122a1 and 122b1 disposed on the lower surface and the upper surface of the first insulating layer 121a, a first lower wiring layer 122c1 disposed on the lower surface of the second insulating layer 121b covering the lower surface of the first insulating layer 121a, and a first upper wiring layer 122d1 disposed on the upper surface of the third insulating layer 121c covering the upper surface of the first insulating layer 121a. The second vertical connection conductor 120P2 may include a pair of second intermediate wiring layers 122a2 and 122b2 disposed on the lower surface and the upper surface of the first insulating layer 121a, a second lower wiring layer 122c2 disposed on the lower surface of the second insulating layer 121b covering the lower surface of the first insulating layer 121a, and a second upper wiring layer 122d2 disposed on the upper surface of the third insulating layer 121c covering the upper surface of the first insulating layer 121a.

The pair of first intermediate wiring layers 122a1 and 122b1 may be electrically connected to each other by a first intermediate wiring via 123a1 penetrating the first insulating layer 121a. The first lower wiring layer 122c1 may be electrically connected to the lower wiring layer 122a1 among the pair of first intermediate wiring layers 122a1 and 122b1 by the first lower wiring via 123b1 penetrating the second insulating layer 121b. The first upper wiring layer 122d1 may be electrically connected to the upper wiring layer 122b1 among the pair of first intermediate wiring layers 122a1 and 122b1 by the first upper wiring via 123c1 penetrating the third insulating layer 121c.

The pair of second intermediate wiring layers 122a2 and 122b2 may be electrically connected to each other by a second intermediate wiring via 123a2 penetrating the first insulating layer 121a. The second lower wiring layer 122c2 may be electrically connected to the lower wiring layer 122a2 among the pair of second intermediate wiring layers 122a2 and 122b2 by the second lower wiring via 123b2 penetrating the second insulating layer 121b. The second upper wiring layer 122d2 may be electrically connected to the upper wiring layer 122b2 among the pair of second intermediate wiring layers 122a2 and 122b2 by the second upper wiring via 123c2 penetrating the third insulating layer 121c.

The thickness of the first insulating layer 121a may be greater than the thickness of each of the second insulating layer 121b and the third insulating layer 121c. The first insulating layer 121a may be relatively thicker than other insulating layers and may improve rigidity of the package. The second insulating layer 121b and the third insulating layer 121c may have a larger number of wiring layers 122c and 122d.

By way of summation and review, a single die package may be limited in terms of high performance. Further, there may be limitations on a size of the package when multiple dies are disposed side by side in the package or when the single die package is combined in a package-on-package arrangement.

As described above, embodiments may provide a semiconductor package that enables high performance while a size of the package is reduced. In an example embodiment, a plurality of semiconductor chips may be connected to a redistribution layer using different methods in a single package. Thus, a semiconductor package that enables high performance while reducing the size of the package may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
a redistribution substrate including a first redistribution structure;
a frame on the redistribution substrate, the frame including a first vertical connection conductor and a second vertical connection conductor that are electrically connected to the first redistribution structure, the frame having a through-hole;
a first semiconductor chip in the through-hole, and having a first active surface, on which a first connection pad is disposed, and a first inactive surface that opposes the first active surface, the first connection pad being connected to the second vertical connection conductor by the first redistribution structure;

a second semiconductor chip on the first semiconductor chip, and having a second active surface, on which a second connection pad is disposed, and a second inactive surface that opposes the second active surface;
an encapsulant on the redistribution substrate, and encapsulating at least a portion of the frame, the first semiconductor chip, and the second semiconductor chip;
a second redistribution structure on the encapsulant;
a conductive wire electrically connecting the second connection pad and the second vertical connection conductor; and
a vertical connection via penetrating a portion of the encapsulant and electrically connecting the second redistribution structure and the first vertical connection conductor.

2. The semiconductor package as claimed in claim 1, wherein:
the first active surface of the first semiconductor chip contacts the redistribution substrate, and
the second inactive surface of the second semiconductor chip faces the first inactive surface of the first semiconductor chip.

3. The semiconductor package as claimed in claim 1, wherein a thickness of the first semiconductor chip is greater than a thickness of the second semiconductor chip.

4. The semiconductor package as claimed in claim 1, wherein a side surface of the first semiconductor chip has a step with respect to a side surface of the second semiconductor chip.

5. The semiconductor package as claimed in claim 4, wherein a width of the first semiconductor chip is greater than a width of the second semiconductor chip.

6. The semiconductor package as claimed in claim 1, wherein the second inactive surface of the second semiconductor chip is located at a level that is higher than an upper surface of the frame.

7. The semiconductor package as claimed in claim 1, wherein the first and second vertical connection conductors are disposed to surround the through-hole in a plan view, the second vertical connection conductor being disposed closer to the through-hole than the first vertical connection conductor.

8. The semiconductor package as claimed in claim 1, wherein:
the frame further includes a first insulating layer on an upper surface of the redistribution substrate, and a second insulating layer on an upper surface of the first insulating layer,
the first vertical connection conductor includes a first lower wiring layer in contact with the upper surface of the redistribution substrate, and embedded in the first insulating layer, a first intermediate wiring layer on the upper surface of the first insulating layer and embedded in the second insulating layer, and a first upper wiring layer on an upper surface of the second insulating layer,
the second vertical connection conductor includes a second lower wiring layer in contact with the upper surface of the redistribution substrate and embedded in the first insulating layer, a second intermediate wiring layer on the upper surface of the first insulating layer and embedded in the second insulating layer, and a second upper wiring layer on the upper surface of the second insulating layer, and
the first vertical connection conductor is spaced apart from the second vertical connection conductor.

9. The semiconductor package as claimed in claim 8, wherein:

the first and second vertical connection conductors further include a surface layer on the first upper wiring layer and the second upper wiring layer, respectively, and
the surface layer is a single layer containing nickel (Ni) or a multilayer containing nickel (Ni) and gold (Au).

10. The semiconductor package as claimed in claim 8, wherein:
the first vertical connection conductor further includes a first lower wiring via connecting the first lower wiring layer and the first intermediate wiring layer, and a first upper wiring via connecting the first intermediate wiring layer and the first upper wiring layer, and
a height of the first upper wiring via is smaller than a height of the vertical connection via.

11. The semiconductor package as claimed in claim 1, further comprising a surface layer on the second redistribution structure, and a passivation layer on the surface layer, wherein:
the second redistribution structure includes a pad portion and a pattern portion,
the surface layer is on the pad portion,
the passivation layer has an opening exposing a portion of the surface layer, and
a width of the pad portion is greater than a width of the surface layer.

12. The semiconductor package as claimed in claim 1, wherein:
the second semiconductor chip includes a plurality of second semiconductor chips, and
the plurality of second semiconductor chips are stacked in a direction that is perpendicular to the first inactive surface.

13. The semiconductor package as claimed in claim 12, wherein each of the plurality of second semiconductor chips has the same width as each other, or has a relatively smaller width as each of them is located farther away from the first inactive surface.

14. The semiconductor package as claimed in claim 1, wherein:
the second semiconductor chip includes a plurality of second semiconductor chips, and
the plurality of second semiconductor chips are laterally spaced apart from each other on the first inactive surface.

15. The semiconductor package as claimed in claim 1, further comprising:
a first passivation layer on an other surface of the redistribution substrate, opposing one surface on which the frame is disposed, the first passivation layer having a first opening that exposes at least a portion of the first redistribution structure;
an underbump metal in the first opening;
a connection bump covering the underbump metal; and
a second passivation layer on the encapsulant, and having a second opening that exposes at least a portion of the second redistribution structure,
wherein at least a portion of each of the first and second openings is formed in a position that does not overlap the first semiconductor chip vertically.

16. A semiconductor package, comprising:
a redistribution substrate including a first redistribution structure;
a frame on the redistribution substrate, the frame including a first vertical connection conductor and a second vertical connection conductor that are electrically connected to the first redistribution structure, the frame having a through-hole;

a first semiconductor chip in the through-hole, and including a first connection pad electrically connected to the first redistribution structure;
a second semiconductor chip on an upper surface of the first semiconductor chip, and including a second connection pad electrically connected to the second vertical connection conductor through a conductive wire;
an encapsulant encapsulating at least a portion of the frame, the first semiconductor chip, and the second semiconductor chip; and
a second redistribution structure on the encapsulant, and electrically connected to the first vertical connection conductor, wherein:
a thickness of the first semiconductor chip is greater than a thickness of the second semiconductor chip,
a width of the first semiconductor chip is greater than a width of the second semiconductor chip, and
an upper surface of the second semiconductor chip is located at a level that is higher than an upper surface of the frame.

17. The semiconductor package as claimed in claim 16, further comprising an attachment member between the first semiconductor chip and the second semiconductor chip,
wherein a bonding surface between the attachment member and the second semiconductor chip is located at a level that is equal to or higher than the upper surface of the frame.

18. The semiconductor package as claimed in claim 16, further comprising a resist layer on the frame, and covering a portion of uppermost surfaces of each of the first and second vertical connection conductors,
wherein an upper surface of the resist layer is located at a level that is higher than a lower surface of the second semiconductor chip.

19. The semiconductor package as claimed in claim 16, wherein the second semiconductor chip is disposed to overlap the first semiconductor chip, and a side surface of the second semiconductor chip is spaced apart from a side surface of the first semiconductor chip in a plan view.

20. A semiconductor package, comprising:
a lower semiconductor package, an upper semiconductor package on the lower semiconductor package, and a conductive bump electrically connecting the lower semiconductor package to the upper semiconductor package, wherein:
the lower semiconductor package includes:
a redistribution substrate including a first redistribution structure,
a frame on the redistribution substrate, the frame including a first vertical connection conductor and a second vertical connection conductor that are electrically connected to the first redistribution structure, the frame having a through-hole,
a first semiconductor chip in the through-hole, and including a first connection pad electrically connected to the first redistribution structure,
a second semiconductor chip on an upper surface of the first semiconductor chip, and including a second connection pad electrically connected to the second vertical connection conductor through a conductive wire,
an encapsulant encapsulating at least a portion of the frame, the first semiconductor chip, and the second semiconductor chip, and
a second redistribution structure on the encapsulant, and electrically connected to the first vertical connection conductor,
the upper semiconductor package includes:
a redistribution member including redistribution pads electrically connected to the second redistribution structure,
a third semiconductor chip on the redistribution member and electrically connected to the redistribution pads, and
an encapsulating member encapsulating the third semiconductor chip,
a thickness of the first semiconductor chip is greater than a thickness of the second semiconductor chip,
a width of the first semiconductor chip is greater than a width of the second semiconductor chip, and
an upper surface of the second semiconductor chip is located at a level that is higher than an upper surface of the frame.

* * * * *